United States Patent
Batson et al.

(10) Patent No.: US 6,430,073 B1
(45) Date of Patent: Aug. 6, 2002

(54) DRAM CAM CELL WITH HIDDEN REFRESH

(75) Inventors: Kevin A. Batson, Williston; Robert E. Busch, Essex Junction; Garrett S. Koch, Jeffersonville, all of VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/730,673

(22) Filed: Dec. 6, 2000

(51) Int. Cl.[7] .............................................. G11C 15/00
(52) U.S. Cl. ........................................ 365/49; 365/149
(58) Field of Search ........................ 365/49, 156, 149, 365/154, 189.01, 189.07, 190; 711/108

(56) References Cited

U.S. PATENT DOCUMENTS

| | | | |
|---|---|---|---|
| 4,110,841 A | 8/1978 | Schroeder | 365/205 |
| 4,412,314 A | 10/1983 | Proebsting | 365/222 |
| 4,653,030 A | 3/1987 | Tachibana et al. | 365/222 |
| 4,688,196 A | 8/1987 | Inagaki et al. | 365/222 |
| 4,833,643 A * | 5/1989 | Hori | 365/49 |
| 4,970,689 A | 11/1990 | Kenney | 365/189.01 |
| 4,991,136 A | 2/1991 | Mihara | 365/49 |
| 5,111,427 A * | 5/1992 | Kobayashi et al. | 365/49 |
| 5,319,590 A | 6/1994 | Montoye | 365/49 |
| 5,598,115 A | 1/1997 | Holst | 326/119 |
| 5,703,803 A | 12/1997 | Shadan et al. | 365/49 |
| 5,724,296 A | 3/1998 | Jang | 365/222 |
| 5,757,693 A | 5/1998 | Houghton et al. | 365/149 |
| 5,761,114 A | 6/1998 | Bertin et al. | 365/168 |
| 5,909,400 A | 6/1999 | Bertin et al. | 365/187 |
| 5,949,696 A * | 9/1999 | Threewitt | 365/49 |
| 5,999,435 A | 12/1999 | Henderson et al. | 365/49 |
| 6,188,594 B1 * | 2/2001 | Ong | 365/49 |

OTHER PUBLICATIONS

IBM Technical Disclosure Bulletin 31, Mar. 1989, Content Addressable Memory Structures, pp. 1–4.
IBM Technical Disclosure Bulletin, Feb. 1989, DRAM Current Gain Cell With Local Refresh, pp. 1–2.
Mosaid Technologies Incorporated, The Next Generation of Content Addressable Memories, Sep. 1999, 7 pages.

* cited by examiner

Primary Examiner—Richard Elms
Assistant Examiner—Anh Phung
(74) Attorney, Agent, or Firm—Schmeiser, Olsen & Watts; Steven Capella

(57) ABSTRACT

A Dynamic Content Addressable Memory (DCAM) cell topology that contains fewer that can perform a "hidden" refresh of stored data that does not delay nor interrupt the CAM search cycle, thereby providing SCAM-like performance. A non-destructive read operation, is performed such that the stored-data does not have to be written back because of a refresh-read operation. A reliable CAM search can be performed after a read operation and before or even while the refresh-data is being written back. Soft-error detection processes can be performed on each CAM entry during the pendency of the refresh cycle. The DCAM cell can be used in a digital system such as a digital computer and a Network Router.

19 Claims, 6 Drawing Sheets

DRAM CAM CELL WITH HIDDEN REFRESH

BACKGROUND OF THE INVENTION

1. Technical Field

The invention relates generally to semiconductor memory devices, and more specifically to a Dynamic Content Addressable Memory (DCAM) Cell.

2. Related Art

Modern telecommunication networks comprise digital data networks that transmit data in packets or blocks containing address fields for dynamically routing the data packets or blocks through the network (e.g., to the destination address) at high speeds. The fastest searching of stored data may be accomplished using a Content Addressable Memory (CAM).

As the size of networks (e.g., intranets and the Internet) increase the need for larger CAM arrays increases, and accordingly, the need to attach more CAM cells to a common bit line increases. Content Addressable Memory (CAM) arrays of the related art are generally implemented with either conventional Static RAM (SRAM) or conventional destructive-read Dynamic RAM (DRAM) hardware designs, and therefore have all the disadvantages and limitations of one such hardware design or the other.

A typical ternary Static CAM (SCAM) of the relate art contains two six-transistor SRAM storage cells plus an XNOR functional group containing four additional transistors, thus a total of 16 transistors per SCAM cell. An SCAM is generally more vulnerable than a DCAM to corruption of stored data by Soft-Errors (e.g., stored data errors due to exposure of circuits to ambient radiation).

A typical ternary Dynamic CAM (DCAM) cell of the related art may contain fewer transistors than an SCAM, but may have disadvantages including destructive-reads and slower performance. A typical ternary DCAM of the related art includes two data storage capacitors that must be periodically read and refreshed by charge-transfer via pass-transistors that are also used for reading and writing data by charge-transfer, in addition to an XNOR comparison circuit containing four transistors. The charge stored in the data storage capacitors of a DCAM cell is gradually dissipated by leakages within the cell. For this reason, the information stored in the leaking capacitors must be periodically "refreshed," i.e., the charge is read and then re-written back into the storage cell. The related art provides various DCAM cell structures that are limited in that refresh-reads proceed by charge-transfer thus destroying the data stored in the data-storage capacitors, making the DCAM cell temporarily unavailable for CAM searches until the data is written back into the DCAM cell by a refresh-write. The entire refresh read-write period thereof generally occupies time during which CAM searches can not be performed. Also, limitations of the ability to sense the relatively small charge-transfer from the storage capacitor to a capacitive bit-line coupled thereto limits the maximum array population on such bit-lines, and/or requires larger storage capacitors.

An example of such a destructive-read DCAM is disclosed in U.S. Pat. No. 5,949,696 issued to Threewitt. A variation on the ternary CAM cell disclosed by Threewitt that provides a separate search-line and a separate bit-line for each data storage capacitor of the CAM entry, is depicted in FIG. 1, and is similarly limited by an inherently-destructive read. A read operation for a refresh of the DCAM circuit of the related art depicted in FIG. 1 is performed by charge transfer of the charge stored in a data storage capacitor (e.g. SB0 or SB1) through a pass-Docket transistor (e.g., T0R or T1R, respectively) and through a bit line (e.g. NBIT or BIT, respectively).

In implementing CAMS, it is desirable to minimize the transistor count and/or CAM cell size, and to increase array utilization. In implementing DCAMs it is desirable to perform the refresh of stored data with minimal delay of or interference with CAM search operation.

SUMMARY OF THE INVENTION

Accordingly, the present invention provides, among other things, an improved Dynamic Content Addressable Memory (DCAM) cell topology that contains fewer than the 16 transistors of the typical Static Content Addressable Memory (SCAM) of the related art, but that can perform a "hidden" refresh of stored data that does not delay nor interrupt the CAM search cycle, thereby providing SCAM-like performance. The inventive DCAM achieves its search performance by simultaneously comparing all entries stored in the memory with an externally applied "comparand." Words stored in entries in the CAM, which "match" the comparand result in maintaining the non-conductive barrier preventing charge transfer between their respective Match Lines and ground. Conversely, all words stored in entries that contain even a single bit that mismatches (i.e., does not match) the corresponding comparand bit results in a conducting path between each of their Match Lines and ground. Embodiments of the invention provide a non-destructive read operation, such that the stored-data does not have to be written back because of a refresh-read operation; and a reliable CAM search can be performed after a read operation and before or even while the refresh-data is being written back. Soft-error detection processes well known to persons skilled in the art may be performed on each CAM entry during the a pendency of the refresh cycle (or independent of the refresh cycle) without delaying or interrupting CAM search operations. Embodiments of the invention provide CAM cell circuit topologies that can allow more CAM cells to be tied to a read-bit-line of a CAM array than may be tied to a read-bit-line of a DCAM array the related art, thus resulting in greater array utilization.

A first aspect of the invention provides a digital system that performs the function of a network router, and a CAM array having a CAM cell including: a data storage device; a pass-gate including a stack of first and a second pass-switches, the First Pass-Switch being coupled to in series with the Second Pass-Switch at a Node; a Data Storage Device operatively controlling the Second Pass-Switch; and a Third Pass-Switch connected to the Node for detecting the logic state of the Data Storage Device.

A second aspect of the invention provides a method for performing a plurality of CAM searches in a CAM array having a CAM entry that has a word of searchable data stored in a plurality of storage capacitors, comprising the steps of performing a non-destructive determination of the word and subsequently performing a CAM search.

The foregoing and other features of the invention will be apparent from the following more particular description of embodiments of the invention, as illustrated in the accompanying drawings.

BRIEF DESCRIPTION OF THE DRAWINGS

Embodiments of the present invention will hereinafter be described in conjunction with the appended drawings, where like designations denote like elements, and wherein.

DETAILED DESCRIPTION OF EMBODIMENTS OF THE INVENTION

Figure 1:
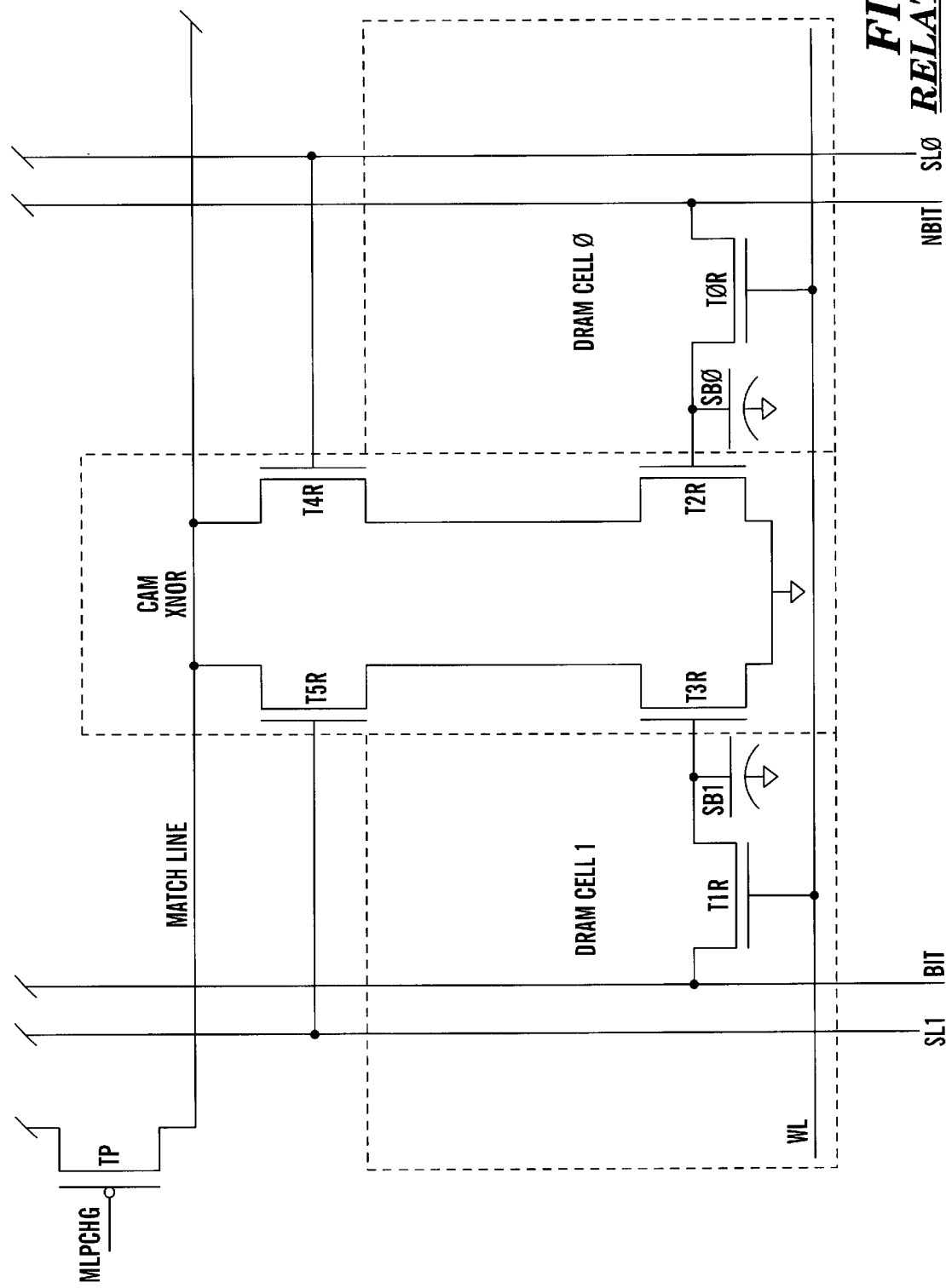
FIG. 1 is a block circuit diagram of a destructive-read DCAM cell of the related art.
Figure 2A:
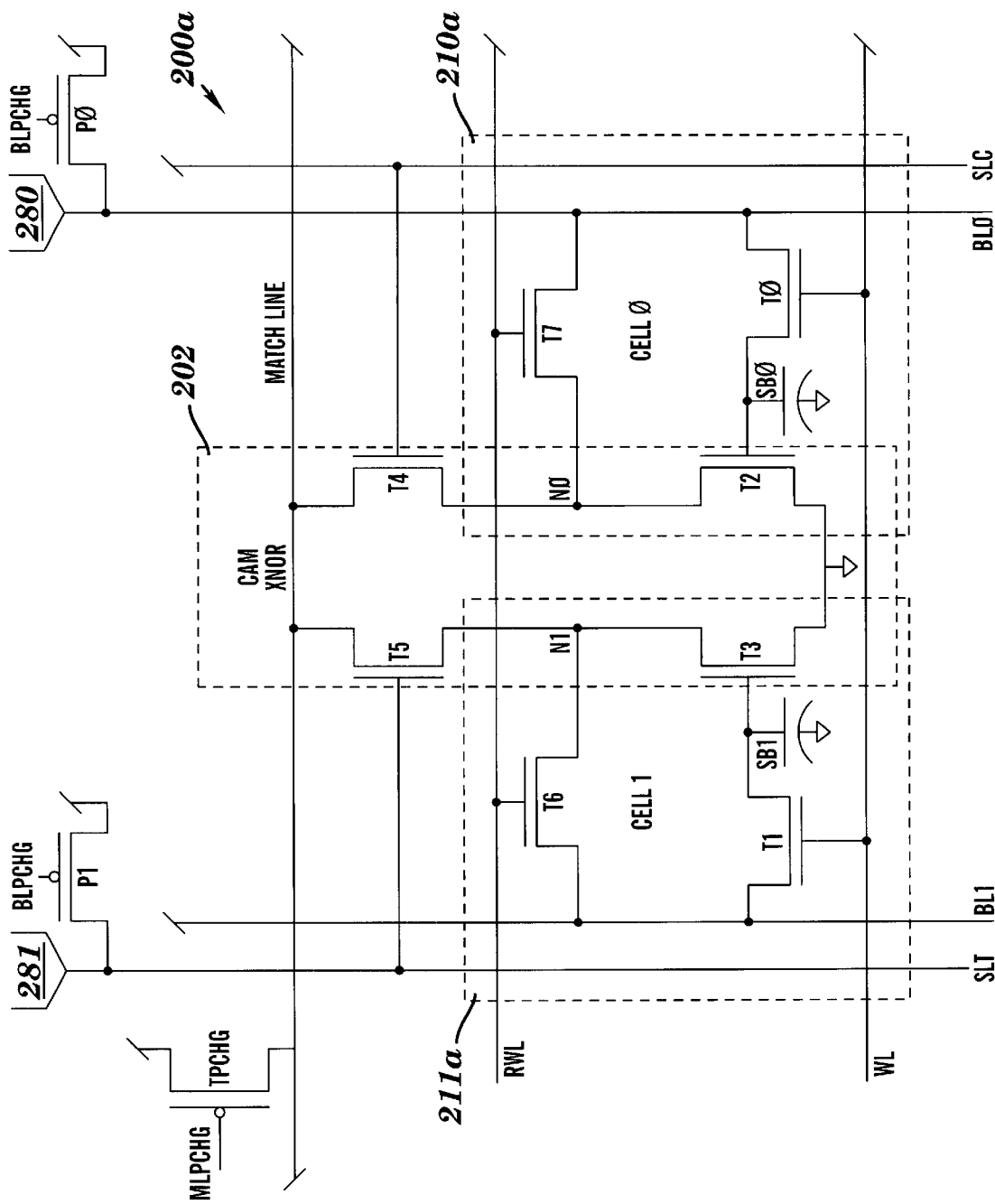
FIG. 2A is a circuit diagram of a DCAM cell that supports non-destructive reads and "hidden" refresh of searchable stored data in accordance with embodiments of the invention.

FIG. 2A depicts a circuit diagram of a ternary Dynamic Content Addressable Memory (DCAM) cell 200a in accordance with an embodiment of the present invention. The inventive ternary DCAM cell 200a includes two capacitors (SB0 and SB1) that function as data storage devices. Each of these capacitors is independently charged High to store a logical One ("1") or discharged Low to store a logical Zero ("0"). Ternary DCAM 200a further comprises two memory storage cells (CELL0=210a, CELL1=211a) each of which is merged with one of the two transistor stacks (T2–T4 and T3–T5 respectively) of the XNOR comparison circuit 202 that is connected between the MATCH LINE and ground. By storing a "0", or a "1" (preferably a "0") in both memory storage cells (e.g., 210a and 211a), the ternary DCAM cell 200a stores a "mask" state which allows a local mask logic value to be stored within a given word entry. The ability to store a "mask" logic state in each DCAM cell (e.g., 200a) in a DCAM entry allows bit-level masking of data stored in an CAM array of DCAM cells. The bit-level masking facilitates and/or enables the storing and comparing of an address range using the present invention and is beneficial in, inter alia, network address filtering applications.

Figure 2B:
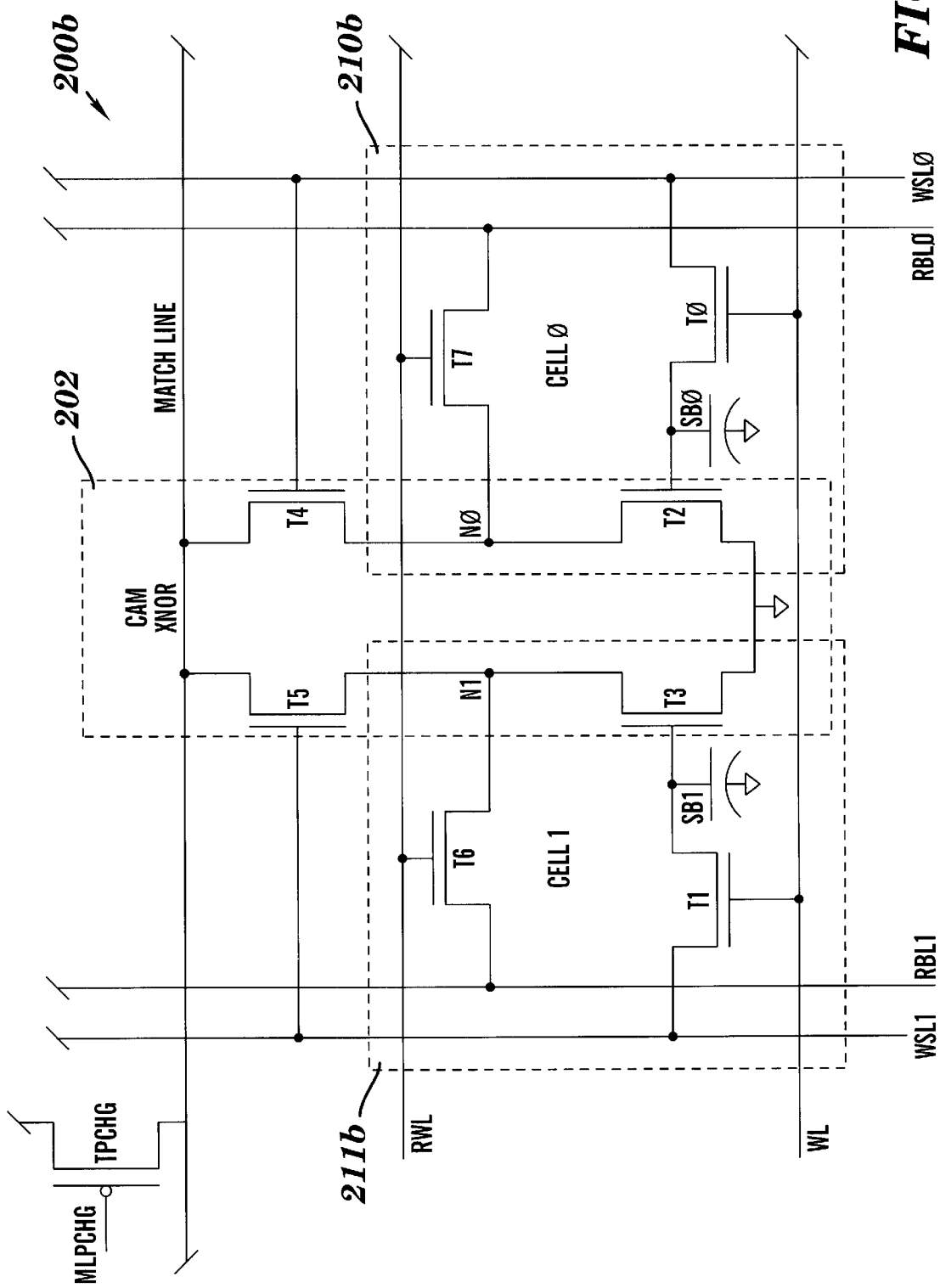
FIG. 2B is a circuit diagram of an alternative embodiment of the inventive DCAM cell of FIG. 2A wherein separate bit-lines are provided for reading and writing.
Figure 2C:
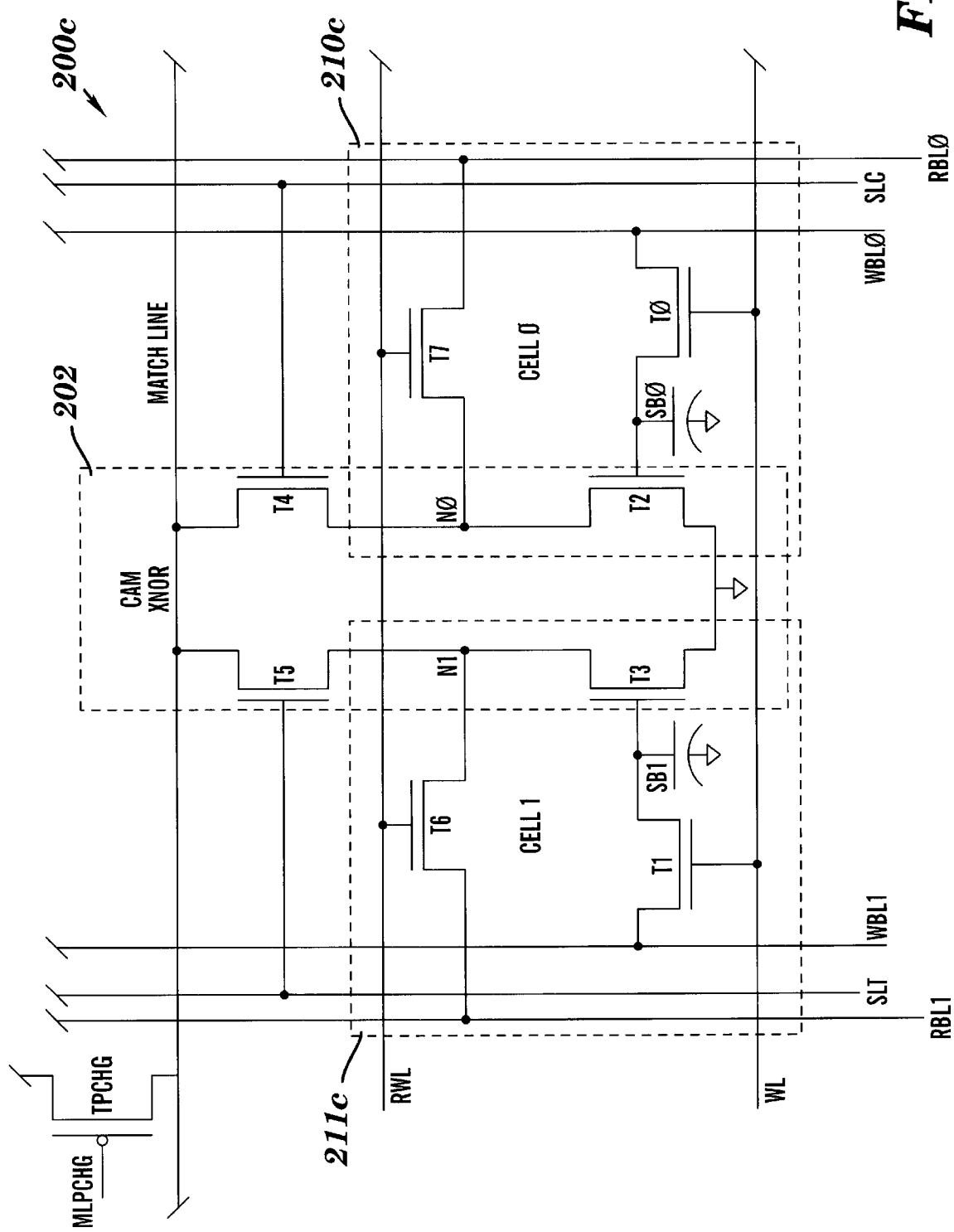
FIG. 2C is a circuit diagram of an alternative embodiment of the inventive DCAM cell of FIG. 2A wherein separate bit-lines are provided for reading and writing, and separate search lines are provided.

Embodiments of the inventive DCAM cell comprise an Exclusive Negative OR (XNOR) logic function implemented by an XNOR Gate 202 (as shown in FIGS. 2A, 2B, 2C) including four (4) transistors arranged in two parallel stacks of two (2) stacked transistors. Each transistor stack includes a first pass-switch (e.g. NFET transistor T2 or T3) and a second pass-switch (e.g. NFET transistor T4 or T5), the first pass-switch being coupled to in series with the second pass-switch at a node (e.g., N0 or N1 respectively). Because each transistor stack (e.g., T1–T2 and T1–T3) of the XNOR Gate 202 functions physically independently of the other, is not necessary for proper logical operation of the DCAM that the two transistor stacks (e.g., T0–T2 and T1–T3) of one ternary DCAM cell 200a be located physically adjacent to one another on the integrated circuit (IC) chip. The ternary DCAM cell 200a may therefore be "split" in to "halves" (with other halved-DCAM cells disposed in between each such half), provided that all such half-DCAM cells are connected to the same Match Line of the CAM entry. For example all of the "True halves" of the DCAM cell of an entry can be segregated on one end of the entry's Match Line, while all of the "Complement halves" of the DCAM cell of an entry can be segregated on the opposite end of the entry's Match Line. Search lines and bit lines would be similarly segregated to follow the respective halves of the DCAM cell.

Because, the XNOR transistors coupled conductively to the Match Line (i.e, T4, T5 in XNOR 202) are ideally OFF while the Match Line is pre-charged High, prior to each CAM search, the non-destructive read through pass-transistors (e.g., T2–T7, T3–T6) may be performed prior to a CAM search and while the XNOR transistors coupled conductively to the Match Line (T4, T5) are OFF. Because the non-destructive read inherently leaves the contents of the data storage devices (e.g., capacitors SB0, SB1) undisturbed, a CAM search operation can be afterwards performed without the necessity of first writing-back the data read-from the storage capacitor. Therefore, in embodiments of the invention, a non-destructive refresh-read operation may be "hidden" from the CAM search cycle in the sense that a refresh-read performed does not delay or prevent a subsequent CAM-search from being performed. A refresh-write can be performed following such a non-destructive refresh-read either, before, during or after the performance of a CAM search.

Persons skilled in the art will recognize that the connection of the DCAM cell's XNOR stacks to ground can be a direct connection as shown in FIG. 2A, or this connection can be selectively interruptible by the pass-switch (e.g. pass-transistor) of a "global" bit-mask (not shown). A "global" bit mask coupled to the XNOR circuit functions such that when a global bit-mask signal is asserted the corresponding bit position in every word stored in the CAM array is eliminated from the compare function (i.e., it becomes a global "don't care" (forced match) logic value for every word in the CAM array). Such global masking is useful in comparing or searching for ranges of data values stored in the CAM entries.

The plurality of parallel transistor stacks (e.g., T2–T4 and T3–T5) of all the XNOR comparison circuits of all the CAM cells in a CAM entry form a Match-Line Pass-Gate. The Match Line Pass-Gate operates such that a pre-charged High Match Line will remain High in the case of a MATCH-ing entry, but will be discharged to or near ground voltage level (indicating a Miss) if any one or more ternary bits stored in the CAM entry mis-matches the corresponding bit of the comparand. Alternatively, the Match Line Pass-Gate and the DCAM cell of the present invention will also support a pre-charged-Low Match Line in a match-detection system, such as is disclosed in U.S. patent application of Towler et. also, Ser. No. 09/716,511 filed Nov. 20, 2000, the relevant portions of which are incorporated herein by reference, wherein the subject matter and the claimed invention were at the time the invention was made, owned by, or subject to, an obligation for assignment to International Business Machines Corp, which is the assignee of the present invention.

The writing and reading of data into or from the memory storage cells (210a and 211a) can be performed by charge-transfer, as in the related art DCAMs, through the bit lines (BL0 and BL1 respectively) and through pass-transistors (T0 and T1 respectively) held ON (i.e., conducting) when the Word-Line WL is held High. The method of writing or reading data by charge-transfer in the present invention is the same or similar as the method of writing and reading by charge-transfer used in DCAMs of the related art. However, reading by charge-transfer is unnecessary in embodiments of the present invention because the present invention enables the reading of stored data without destructive charge-transfer of the charge stored in the data storage capacitors (e.g., SB0 and SB1).

A non-destructive read may be performed at each memory storage cell (e.g., 210a, 211a) of DCAM cell 200a, while the respective search line (e.g., SLC or SLT) is held Low, by pre-charging the respective Bit-Line (e.g., BL0, BL1 respectively) to a High logic voltage, and then turning the pass-transistor (e.g., T7, T6 respectively) ON (i.e., conducting) by asserting a High logic voltage on the gate thereof (e.g., by asserting a High logic voltage on the Read-Word Line (RWL)), and then sensing a current and/or a voltage on the respective Bit-Line (e.g., BL0, BL1) that is representative of the state of the respective data storage device (e.g., SB0 and SB1 respectively). The Bit-Lines may be pre-charged High through a plurality of pass-switches (e.g., P-type pass-transistors P0 and P1) connected between the supply voltage and the respective Bit-Lines, and that are operatively controlled by a Bit-Line-PreCHarGe signal (BLPCHG). If the capacitor SB0 stores a logic High voltage, the pre-charged High bit-line (e.g., BL0) operatively coupled to pass-transistors (e.g., T2 and T7) will drop to or towards a Low voltage level during the non-destructive read operation, due to charge-transfer from the pre-charged bit-line (e.g., BL0) to ground through the ON (i.e., current conducting) pass-transistors (T2 and T7). If the capacitor SB0 stores a logic Low voltage, the pre-charged High bit-line (e.g., BL0) operatively coupled to pass-transistors (e.g., T2 and T7) will remain at the pre-charged High voltage level during the non-destructive read operation, due to lack of charge-transfer from the pre-charged bit-line (e.g., BL0) to ground through said OFF (i.e., non-conducting) pass-transistors (T2 and T7).

A non-destructive read of an entire entry comprised of a plurality of the inventive DCAM cells (e.g. 200a) may be performed, while all of the Search Lines (e.g., SLC and SLT) are held Low, by pre-charging all the Bit-lines (e.g., BL0, BL1) to a High logic voltage, and then turning ON all the pass-transistors (e.g., T7, T6) by asserting a High logic voltage on the Read-Word Line (RWL), and then sensing a current and/or a voltage on all the Bit-lines (e.g., BL0 and BL1). A non-destructive-read of the entire CAM entry may be a refresh-read performed, while all the XNOR transistors coupled directly to the MATCH- LINE (e.g., T4, T5) are OFF, performed for the purpose of ultimately refreshing the contents of the data storage devices (e.g, capacitors SB0 and SB1). In this case, the stored data word is determined (e.g., read inverted) from the DCAM entry via the read-only pass-transistors (e.g., T7 and T6) and via the bit-lines (e.g., BL0, BL1). The data thus read from the data storage devices may then be asserted (re-inversion may first be necessary) and stored on the bit-lines (e.g., BL0 and BL1) themselves until the Word Line (WL) is asserted to perform a refresh-write of the stored data asserted on the bit-lines. Alternatively, a binary Buffer or a Register external to the CAM array may be used to temporarily store one stored-data word (either inverted or non-inverted) or to store a plurality of such stored-data words that have been read from a plurality of DCAM entries, until written-back into the same entr(ies).

The non-destructive read of the entire CAM entry may also be performed as a Random Access (i.e., a RAM memory-access), whenever all the XNOR transistors coupled directly to the MATCH- LINE (e.g., T4, T5 respectively) of the CAM entry being read are OFF (i.e., all Search Lines in the CAM array, e.g., SLC, SLT, are Low).

Further details of the non-destructive-read operation of any storage capacitor in the CAM entry may be explained by reference to an example of reading data stored in storage capacitor SB0 in FIG. 2A. If the storage capacitor (e.g., SB0) is storing a logic ONE represented by a logic High voltage level stored in the capacitor, the transistor T2 of the XNOR circuit 202 will be ON (because its gate is being held High by the capacitor SB0), and a current can flow from the pre-charged High bit-line (e.g., BL0) through T2 to ground, having the effect of pulling the voltage level of bit-line BL0 towards ground. This current and/or the attendant drop of voltage on bit-line BL0 may be sensed by any appropriate sensing circuit known to persons skilled in the art coupled to the bit-line (BL0), and may be registered as indicating that a logic ONE is stored in the data storage device (i.e., capacitor SB0). Conversely, the lack of such a current, or the lack of such a voltage drop on BL0, may be sensed and registered as indicating that a logic Zero is stored in the data storage device (i.e., capacitor SB0).

The DCAM's support circuitry (not shown) allows the system hardware to read the data stored in the DCAM's memory storage cells (210a and 211a), and write to the DCAM's memory storage cells. The DCAM's support circuitry also provides refresh timing circuitry to periodically refresh the DCAM entry's leaking data storage capacitors. A logical ONE stored as a charge in any of the DCAM entry's capacitors will eventually discharge to a logical Zero unless the Refresh circuitry recharges the capacitor periodically. The DCAM's support circuitry may include: Sense amplifiers to detect the state of (e.g., to amplify the signal or charge stored) on a data storage device (e.g. storage capacitor SB0) through a bit-line (e.g., BL0); Address logic to select rows and columns; Row Address Select (RAS) and Column Address Select (CAS) logic to latch and resolve the row and column addresses and to initiate and terminate random access read and write operations; Read and write circuitry to Write (i.e., store) information in the memory's storage cells (e.g., 210a and 211a) or to Read that which is stored there; Internal counters or registers to keep track of the refresh sequence, or to initiate refresh cycles as needed; Output logic to assert the address of a MATCH-ing CAM entry (e.g, a HIT) when found by a CAM search.

A voltage sense amplifier (SA) may be used to detect the logic state of the data storage device (e.g., capacitor SB0), even before the bit-line (BL0) is able to drop fully from rail to rail (i.e., from a pre-charged High voltage to ground). If a voltage-sensing circuit is used, a brief strobing signal (e.g. a pulse SETSA, See FIG. 3) may be used to enable the voltage-sensing circuit (e.g., SA) for a relatively brief time interval during which any sense-able drop of the voltage on Bit-line shall be expected to have occurred or not-occurred depending upon the contents of the storage capacitor (e.g., SB0). The sensing strobe signal (e.g., SETSA) may be pulsed at an optimal time by a circuit that includes a Dummy-Bit-Line as a timing model and implemented on the same integrated circuit chip, or by any other method known to persons skilled in the art. The sensing of the state of the data storage device (e.g., capacitor SB0) may be thereby performed in a brief time interval immediately before either one of the search lines of the DCAM entry (e.g., SLT and SLC) has been raised to the full High voltage level to effect a CAM search. Greater detail of exemplary timing and relationships of the inventive DCAM cell's circuits, signals and functions may be explained by reference to FIG. 3 in conjunction with the circuit diagram of DCAM cell 200a of FIG. 2A.

Figure 3:
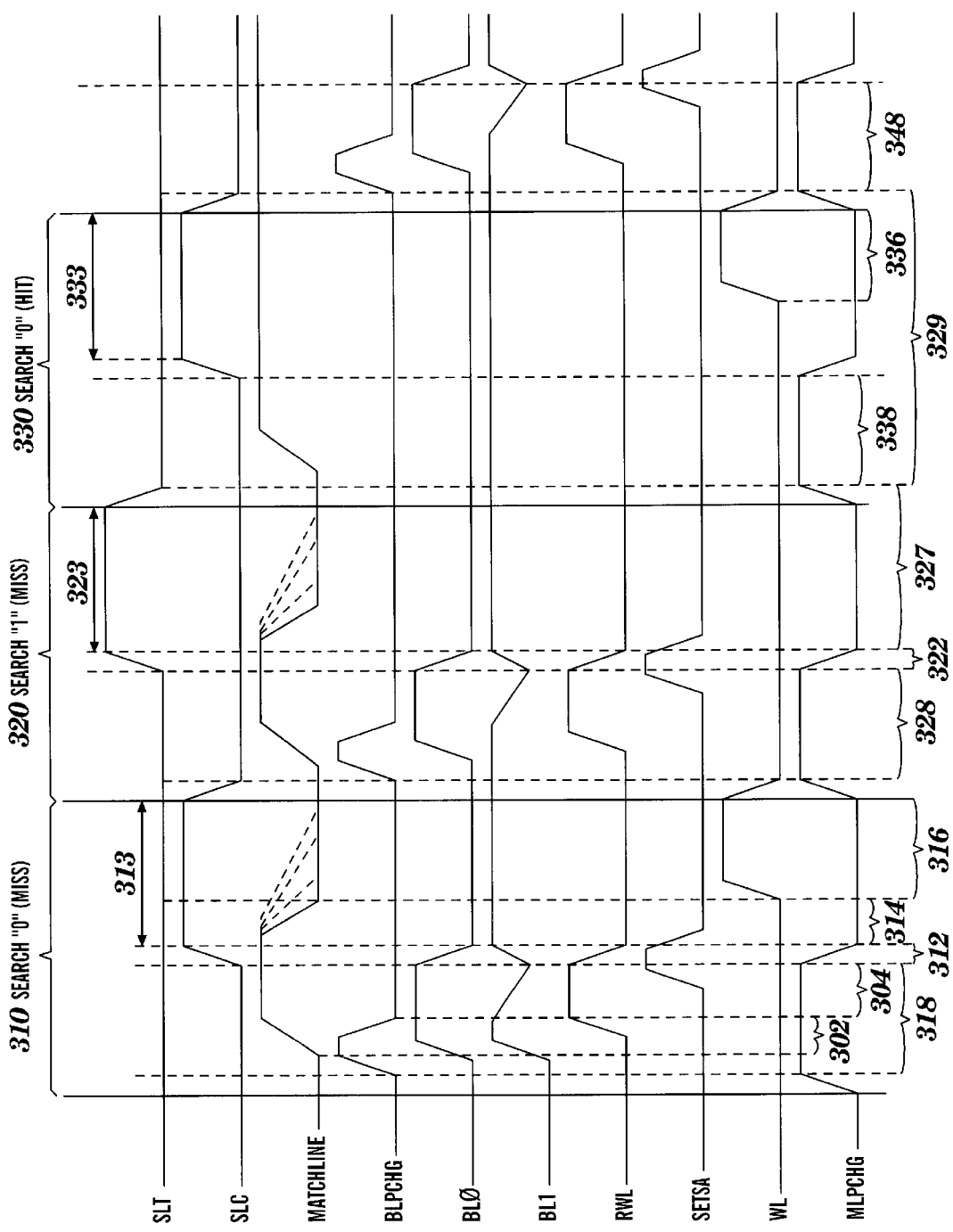
FIG. 3 is a timing diagram illustrating the timing relationships among devices, data and control signals and illustrating methods of operating the inventive DCAM cell of FIG. 2A.

FIG. 3 is a timing diagram that depicts exemplary timing relationships of signals and functions on lines coupled to the inventive ternary DCAM cell 200a of FIG. 2A during a span of time including three consecutive CAM search cycles (310, 320, 330). Each CAM search cycle (e.g., 310, 320, 330) comprises a CAM-search period (i.e. a period during which the stored-data in every entry of the CAM array is compared to a comparand) (e.g., 313, 323, 333 respectively), and a Match Line Pre-Charge period (e.g., 318, 328, 338 respectively) to prepare the Match Line coupled to all the DCAM cells (e.g., 200*a*) of the DCAM entry for the CAM search (e.g., 313, 323, 333 respectively).

A CAM search is performed when one bit of the comparand and that comparand bit's logical complement are asserted respectively on the two search-lines (e.g., SLT and SLC) of each DCAM cell (e.g., 200*a*) of the CAM entry. Thus, during each CAM search period (e.g., 313) one search line (e.g.,SLC) of a given DCAM cell 200*a* will be High, and the other search line (e.g., SLT) will be Low.

The first CAM search cycle 310 depicted in FIG. 3 illustrates an exemplary timing of signals in the inventive ternary DCAM CELL 200*a* during a refresh-read (within period 318 plus 312) and a subsequent refresh-write performed within the CAM search period (313). Although the first search cycle (313) happens to illustrate the case where the CAM cell 200*a* is within a MISS-ing entry of a CAM array, the ability to perform a refresh-read and/or a refresh-write within a CAM search cycle (e.g.310) is not dependent upon the data stored in the entry, and is not dependent upon whether the CAM entry happens to be MISS-ing entry or a MATCH-ing entry.

During each CAM search (e.g., 310, 320, 330), a given CAM entry will be either a MISS-ing entry, or a MATCH-ing entry based upon a comparison of the data word stored in the entry compared with the (unmasked) bits of the comparand being asserted during that particular CAM search. Because a different comparand and/or a different comparand-mask (e.g., a global bit mask) may be asserted to the CAM array during each CAM search cycle, a given CAM entry may be a MISS-ing entry during one CAM search cycle, and the same CAM entry may be a MATCH-ing entry during the very next or any subsequent CAM search cycle, or vice versa. A MISS-ing ternary CAM entry is a CAM entry that happens to be storing a ternary data word that is not logically the same as the unmasked bits of the comparand being asserted during a particular CAM search. Conversely, a MATCH-ing CAM entry is a CAM entry that happens to be storing a ternary data word that is logically the same as the unmasked bits of the comparand being asserted during a particular CAM search.

The inventive DCAM cell's data-comparand comparison function is performed by four pass-switches (e.g., N-channel pass-transistors T2, T3, T4, T5) arranged in two parallel stacks (T2–T4 and T3–T5) forming the XNOR Gate 202. Each of the lower pass-switches (i.e., each of transistors T2 and T3) perform the dual function of supporting the non-destructive-read of the data value stored in the associated data storage device (i.e., capacitor SB0 and SB1 respectively) plus that of enabling the XNOR comparison function within the inventive ternary DCAM cell (e.g. 200*a*, 200*b*, 200*c*).

In the case of a MISS-ing CAM entry, the occurrence of which is indicated by a drop to Low of the Match Line voltage, a current-conducting connection between the MATCH LINE and ground will be established through one or more pass-transistor stacks (e.g., T2–T4, and/or T3–T5) of the XNOR circuit 202. Accordingly, in embodiments of the invention the pre-charged-High MATCH LINE voltage of a MISS-ing entry will drop to a Low (e.g., nearly ground) voltage level, thus indicating the MISS.

In the case of a MATCH-ing entry, the occurrence of which is depicted in the third CAM search cycle (330) in FIG.3, no current-conducting connection between the MATCH LINE and ground will be established through any of the transistor stacks (e.g., neither T2–T4 nor T3–T5) of the XNOR circuits (e.g., 202) in the DCAM cells (e.g. 200*a*) of the CAM entry. Accordingly, in embodiments of the invention the MATCH LINE voltage of a MATCH-ing entry will remain at the pre-charged High voltage level, and this High HIT-event voltage can be detected and therefore a MATCH or HIT may be associated with the unique address of such a MATCH-ing CAM entry.

The second search cycle 320 depicted in FIG. 3 illustrates the timing of signals in the inventive ternary DCAM CELL 200*a* during a non-destructive read (occurring within periods 328 and 322) and a subsequent CAM search 323 in the case where the DCAM cell 200*a* happens to be within a MISS-ing entry of a CAM array. The second search cycle 320 illustrates that a reliable CAM search (323) can be performed in the CAM array immediately after a non-destructive read has been performed in embodiments of an inventive CAM entry (e.g., comprising CAM cells 200*a*, 200*b* and/or 200*c*) without having refresh-written the read-data back into the data storage devices (e.g., SB0 and SB1) in the CAM entry that was read-from.

The third search cycle 330 depicted in FIG. 3 illustrates the timing of signals in the inventive ternary DCAM CELL 200*a* during a refresh-write (occurring within the CAM search period 333) subsequent to a refresh-read (e.g., occurring in a prior CAM search cycle 320) in the case where the DCAM cell 200*a* happens to be within a MATCH-ing entry of a CAM array. The third search cycle 330 illustrates that the refresh-write can be delayed following a refresh-read, allow processing time to perform error (e.g., soft-error) detection analysis on the refresh-read data prior to the refresh-write, without preventing or delaying regular periodic CAM search cycles and reliable CAM searches therein.

In the exemplary embodiments of the inventive DCAM cell (e.g., 200*a*, 200*b*, 200*c*), prior to each CAM search (e.g., 313, 323, 333) the Match Line is pre-charged (either High or Low in accordance with Match-Line Controller design, as previously described), through a pass-switch (e.g., pass-transistor TPCHG) connected to the Match Line that is controlled by a Match Line Pre-Charge control signal MLPCHG. During each Match Line Pre-Charge period (e.g., 318, 328, 338, 348). In an exemplary embodiment of the invention (e.g., 200*a*) wherein the Match Line is pre-charged High, both search lines (i.e., SLT and SLC) of each DCAM cell (e.g., 200*a*) will be held Low (e.g. during a regular Match Line Precharge period 318, 328, 338), thereby turning OFF (i.e. non-conducting) both pass-transistors (e.g. T4 and T5) of the XNOR function 202, so that no conducting path exists between the Match Line and ground, and so that the Match Line will hold the High charge until a CAM search on that DCAM entry is a "MISS" (i.e., the stored data does not match the comparand).

The detection of the state of the memory storage devices (i.e., a non-destructive read of the data stored in the capacitors) in any inventive DCAM entry may be performed within a period of time during which all search lines of the DCAM entry are held Low, (e.g. within the Match Line pre-charge periods 318, 328, 338, 348), through the Bit-Lines (e.g. BL0 and BL1) and through pass-switches (e.g., pass-transistors T6 and T7). Thus, the logic state of each memory storage device (e.g., capacitors SB0 and SB1) of every DCAM cell (e.g., 200*a*) in a given DCAM entry may be detected during each Match Line Pre-Charge period (e.g., 318, 328, 338, 348) of the DCAM cell (e.g., 200a, 200b, or 200c) without destroying the state of (e.g., changing the charge contained in) the memory storage devices (e.g., SB0 and SB1). A refresh-read performed entirely within or performed substantially within such an ordinary and necessary Match Line Pre-Charge period (e.g., 318) does not add significant time to any CAM search cycle (e.g., 310 and 320), and may be said to be a "hidden" refresh-read.

A non-destructive read may be performed by the following sequence of steps: First, pre-charging High the Bit-Lines (e.g. BL0 and BL1) of all DCAM cells (e.g. 200a) of the DCAM array within the Match Line Pre-Charge period (e.g. 318) or before the Match Line Pre-Charge period;

Second, asserting (e.g. High) the Read-Word-Line RWL of the CAM entry-to-be-read in order to turn ON (i.e. conducting) the pass-transistors (e.g., T6 and T7) thereof (while the pass-transistors TO and Ti coupled to the data storage devices SB0 and SB1 in DCAM 200a are OFF) outside of (e.g. before) a CAM search period (e.g., 313); Third, detecting the state of the memory storage devices (e.g., SB0 and SB1) ail through the respective Bit-Lines (e.g. BL0 and BL1) while the pass-transistors (e.g., T6 and T7) are ON, as described above. The state of each of the memory storage devices (e.g. SB0 and SB1) as thus detected may be asserted and/or stored (e.g. stored on the Bit-Lines BL0 and BL1 before 312 15 or during 314 or after the subsequent CAM search 314 and until the next Bit-Line Pre-Charge) and then (316) written-back into the same data storage devices (e.g. SB0 and SB1).

The Bit-Lines can be pre-charged High through a plurality of Bit-Line Pre-CHarGe pass-switches (e.g., p-channel pass-transistors P0 and p1 in FIG. 2A) coupled to a logic High voltage level (e.g. the power supply voltage) and controlled by a Bit-Line PreCHarGe control signal BLPCHG.

The control signal BLPCHG will activate (i.e. turn ON=conducting) the pass-switches (e.g. P0 and P1) to pre-charge the Bit-Lines (e.g. BL0 and BL1 respectively) during or before the Match Line Pre-Charge period (e.g. 318). If a Bit-Line (e.g. BL0 or BL1) is designed to be used both for reading and for writing data (as in DCAM cell 200a in FIG. 2A, but not in DCAM cell 200b nor 200c of FIGS. 2B and 2C) then the use of the Bit-Line (e.g. BL0 or BL1) must be time-multiplexed such that reading and writing operations do not occur at the same times and do not interfere with each other. Therefore, in the DCAM 200a of FIG. 2A, the Bit-Lines can be pre-charged High for non-destructive reading during Match Line Precharging periods (e.g. 318 and 328, 338, and 348) outside of writing-periods (e.g. 316 and 336 during which writing is being performed. However, where separate lines are provided to each memory storage cell (e.g. 210b and 210c in DCAM cells 200b and 200c as shown in FIGS. 2B and 2C respectively) for writing and for reading, the Non-Destructive Read Bit-Line (e.g. RBL0 in FIGS. 2B and 2C) may be pre-charged High before or even while a write operation is being performed on the same or on another DCAM entry in the CAM array. Where separate lines (e.g. RBL0, WBL0) are provided to each memory storage cell (e.g. 210c in DCAM cell 200c. as shown in FIG. 2C) for writing (e.g. WBL0) and for reading (RBL0), and where neither of such lines is also a Search-Line (e.g. SLC) coupled to the XNOR Gate 202, a refresh-reading operation and a refresh-writing operation can be performed at the same time, or during overlapping time periods during a Match Line Pre-Charge period within a CAM search cycle.

Accordingly, a non-destructive read of an entire CAM entry can be "hidden" (i.e., performed without interrupting the periodic Search cycles of the CAM entry) if it is performed during a time interval within a CAM Search Cycle period (e.g., 316) during which all Search Lines coupled to the CAM cell are held Low, e.g., Match Line Pre-Charge period 318). In embodiments of the invention wherein the MATCH LINE is ordinarily Pre-charged High prior to each CAM search, all the search lines will ordinarily be held Low prior to each CAM search in order to Pre-Charge the Match-Line High. During that time interval (e.g. 318) before each next CAM search (e.g., 323), a "hidden" read may performed on the entire CAM entry. The sensing of the state of the data storage devices may be thereby performed in the brief time interval (e.g., 304 and/or 312) before either one of the search lines (SLT and SLC) shall have been raised to the High voltage level to perform a CAM search (323).

Because the read thereby effected has been non-destructive of the data stored in the memory storage devices (e.g., capacitors SB0 and SB1) of the CAM cells (e.g., 200a) of the CAM entry, a CAM search may be performed immediately (313) thereafter without first completing a refresh-write (e.g., 316). The non-destructively read data (acquired during period 318) may be refresh-written back before, while (316), or after (336) the post-read CAM search (313) is performed.

The writing of data into the data storage devices (e.g., capacitors SB0 and SB1) of the DCAM cells 200a, 200b and 200c of FIGS. 2A, 2B and 2C, is performed (e.g., while RWL in 200a is Low) by asserting a High voltage on the Word-Line (WL) and asserting the logical voltage representing bits of the data word on the respective write-enabling lines (e.g., BL0, BL1 in DCAM 200a; WSL0 and WSL1 in DCAM 200b; WBL0 and WBL1 in DCAM 200c). The data represented by voltages thus asserted on the data-bit lines then charges (or discharges according to the data) each data storage capacitors (e.g., SB0 and SB1) of the DCAM cell (e.g., 200a, 200b and 200c). When the Word-Line WL are brought Low, the write-enabling lines may then be used for other purposes, (such as for asserting the bits of the comparand during a CAM search as in 200b in FIG. 2B; or for performing non-destructive reads as described above in DCAM cell 200a in FIG. 2A; or for performing destructive-reads as in the related art DCAM cells) The write-enabling lines (e.g., BL0, BL1 in DCAM 200a; WSL0 and WSL1 in DCAM 200b; WBL0 and WBL1 in DCAM 200c) can be used alternatively for performing destructive-reads of the stored-memory in accordance with conventional methods of the related art, unless the array utilization of the particular DCAM array manufactured in accordance with embodiments of the present invention is too large to support such destructive charge-transfer type reads.

A feature of the inventive DCAM cell is that the refresh-write may begin before, while (316) or after (336) the post-read CAM search (313) is performed, and therefore without delaying the post-read CAM search (313). Thus, embodiments of the invention provide a "hidden" refresh-write in addition to a "hidden" refresh-read. The inventive DCAM cell may therefore be said to provide a "hidden refresh."

The DCAM's memory refresh-cycle, which is ordinarily performed from time to time on each entire word (e.g., entry) of the inventive CAM array, includes a refresh-read operation (e.g. performed within a Match Line Pre-Charge period 318) followed by a refresh-write operation (e.g. performed during a CAM search) both of which may be performed within the same CAM search cycle (e.g. 310). Because the read-operation performed through pass-Docket transistors (e.g., T2–T7 or T3–T6) is non-destructive (i.e., does not alter the charge stored by the storage capacitors SB0 and SB1 respectively), the read-operation does not itself necessitate an immediate write-back of the data read-from the storage capacitor. Accordingly, a CAM search operation (e.g. 313), or even a plurality (i.e., N, wherein N is a positive integer) of CAM search operations, may be performed between the time that such a non-destructive read operation (e.g. 318 or 328) has been performed on a CAM entry and the later time that a refresh-write operation (e.g., 336) is performed on the same CAM entry. Stated another way, the inventive DCAM's refresh cycle does not need to be completed within one conventional DCAM's refresh cycle, and can instead be begun and completed during a period that spreads across the boundaries of a plurality N of CAM search cycles.

This flexibility provides a variety of opportunities, including the opportunity to begin and complete the refresh cycle during periods that do not interfere with other activities of the DCAM cell. The flexibility of the inventive DCAM cell may support the ability to perform error (e.g., soft-error) detection analysis (e.g., using stored parity bits) and perhaps even error-correction algorithms before writing-back the data. The ability to perform error-Docket detection during data refresh and without interfering (e.g., delaying) CAM searches may in turn enable the increase of CAM circuit density, such as by allowing for a reduction of hardware and/or device sizes (e.g. large trench capacitors) that may otherwise be provided to prevent such errors. If a stored data error (e.g., soft-error) is detected in an inventive DCAM entry, data may be corrected and immediately written back, or CAM searches can be suspended until the error can be corrected and correct data is written-back to the entry, or alternatively other measures can be taken to insure reliable CAM search results (such as writing to the entry such data or null-data that will not produce erroneous CAM search results). Because the risk of soft-error may be reduced by error-detection, the inventive DCAM cell may also utilize a parasitic capacitance (e.g. from the source substrate) rather than an explicit (e.g., trench) capacitor to decrease the cost of the storage element. Use of the parasitic capacitance in transistors (e.g., T0–T2 and T1–T3) allows an overall simplification of the manufacturing process of the storage elements (e.g. SB0 and SB1), thus, facilitating the use of a relatively lower cost SCAM-like process. A lower storage capacitance may be utilized with a relatively higher refresh rate and/or a higer error-detection sampling rate. The optimal parasitic capacitance (or total effective capacitance) and the required refresh interval may depend on the particular fabrication process used to make the DCAM of the present invention. Optimization techniques that balance the interrelated factors of circuit density and refresh rate are well known in the art.

The Writing of random data (i.e., data not read-from the same entry) into an entry may be performed whenever no CAM search is being performed and no read operation is being performed. The writing of random data into each storage capacitor (e.g., SB0), is performed in the manner described above by charge-transfer from a voltage asserted on the respective write-enabling lines (e.g., BL0 and BL1) through pass-switches (e.g., pass-transistors T0 and T1) which are operatively controlled by the Word Line (WL).

The MATCH LINE coupled to a CAM entry including the inventive CAM cell (e.g., 200a, 200b, 200c) may be pre-charged to a logic High voltage level by holding all search lines (e.g., SLC, SLT) of the entry Low, thereby turning OFF (i.e., non-conducting) all transistor stacks (e.g., T2–T4 and T3–T5) of all the XNOR circuits (e.g., 202) thereof and then asserting a logic High voltage on the pre-charge transistor TPCHG coupled to the MATCH LINE, thereby conductively connecting the MATCH LINE to the supply voltage (e.g., logic High voltage) level.

FIG. 2C is a circuit diagram of an alternative embodiment of the inventive DCAM cell of FIG. 2A wherein separate bit-lines are provided for reading and writing, and separate search lines are provided.

FIG. 2B depicts a circuit diagram of an alternative embodiment of the inventive DCAM cell of FIG. 2A wherein separate bit-lines are provided for reading (e.g., RBL0 and RBL1) and for writing (e.g. WSL0 and WSL1). The inventive ternary DCAM cell (200b) enables a read (e.g., a non-destructive refresh-read) to be performed at each memory storage cell (e.g., 210b, 211b) thereof, by operation of pass-transistors (e.g., T2–T7, T3–T6) and through a Non-Destructive Read Bit-Lines (e.g., RBL0, RBL1). The refresh-read operation can be performed to read the contents of the entire entry (e.g., comprised of a plurality of DCAM cell 200b) via the Read enabling Bit-Lines (e.g., RWBL0, RWBL1) whenever the Read-Word Line (RWL) coupled to the passe-transistors (e.g., T7 and T6 respectively) is asserted High, while all the Search Lines (e.g., WSL0 and WSL1 respectively) controlling the XNOR stack transistors coupled to the MATCH LINE (e.g., T4, and T5 respectively) are held Low. Alternatively, one of the two individual bits stored in each DCAM cell (e.g., a bit stored in CELL0 of DCAM cell 200b) in a DCAM cell 200b can be reliably read during a CAM search, since during a CAM search operation one of the two complementary Search Lines (e.g., either WSL0 or WSL1) will be Low.

A hidden-refresh-write may be performed through a pass-transistor (e.g., T0, T1; controlled by a Word Line, WL) and through the separate Write Bit-Lines (e.g., WSL0, WSL1) which also function as the DCAM's Search Lines. Because the Write Bit-Lines (e.g., WSL0, WSL1 which also function as the DCAM's Search Lines, it is impracticable in this alternative embodiment to perform refresh-writes while CAM searches are being performed.

FIG. 2C depicts a circuit diagram of an alternative embodiment of the inventive DCAM cells of FIGS. 2A and 2B wherein separate bit-lines are provided for reading (e.g., RBL0 and RBL1) and for writing (e.g. WBL0 and WBL1) and the Search Lines (SLC and SLT) are separate from the bit lines.

The inventive ternary DCAM cell 200c of FIG. 2C enables non-destructive reads same manner as described for DCAM cell 200b in FIG. 2B.

A hidden-refresh-write may be performed in the DCAM cell 200c of FIG. 2C in the same manner as described for DCAM cell 200b in FIG. 2B, however because the write bit lines (WBL0 and WBL1) are separate from the Search Lines (SLC and SLT) a refresh-write may be performed in the DCAM cell 200c of FIG. 2C at the same time that a CAM search is proceeding (just as in the DCAM cell 200a in FIG. 2A).

The inventive DCAM cell (e.g, 200a, 200b, and 200c) may comprise solely NFETS (e.g., N-Channel MOSFETS) as disclosed and depicted in the embodiments shown in FIGS. 2A, 2B, and 2C. PFETs may be substituted for NFETs (e.g., T0, T1, T2, T3, T4, T5, T6, or T7) if control signals etc. are accordingly complemented. Alternately, All-P-Channel embodiments of the inventive DCAM cell are also within the scope of the present invention.

Figure 4:
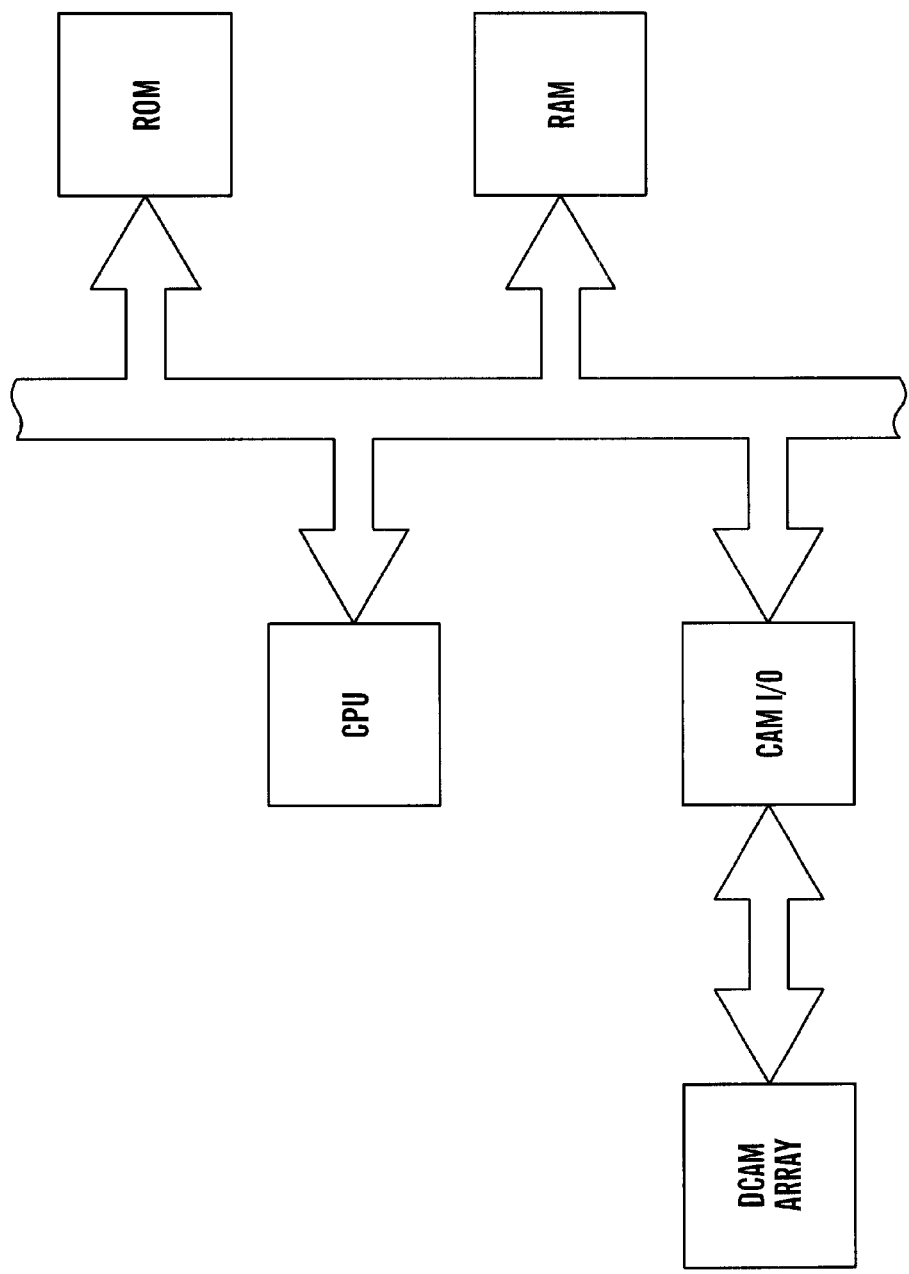
FIG. 4 depicts a representative digital system including a CAM array comprising a DCAM cell depicted in FIGS. 2A, 2B, or 2C.

FIG. 4 depicts a representative digital system including a CAM array comprising a DCAM cell depicted in FIGS. 2A, 2B, or 2C. The digital system, may be for example, a computer, or a network router, comprising a digital processor operatively coupled to a CAM array; the CAM array comprising embodiments of the inventive DCAM cells disclosed herein above.

While the invention has been particularly shown and described with reference to exemplary embodiments thereof, it will be understood by those skilled in the art that the foregoing and other changes in form and details may be made therein without departing from the spirit and scope of the invention. Embodiments of the invention may be implemented as an integrated electronic circuit on a semiconductor substrate, or as an electronic circuit implemented with discrete devices such as switches (e.g., transistors, or electro-mechanical relays, or analogous optical components), or as a combination of these circuits. The following claims are therefore intended to include all such alternative embodiments of the invention. Accordingly, term "passs-witch" is used in the following claims to describe the structure and function provided by the pass-transistors depicted in the accompanying drawings that depict exemplary embodiments of the invention.

We claim:

1. A content addressable memory (CAM) array comprising:
 a CAM cell including:
  a data storage device;
  a pass-gate including a stack of first and a second pass-switches, the first pass-switch being coupled to in series with the second pass-switch at a node;
  a data storage device operatively controlling the second pass-switch; and
  a third pass-switch connected to the node for detecting the logic state of the data storage device, wherein:
   the first pass-switch is operatively controlled by a search line; and
   the third pass-switch being coupled to a first bit line and being operatively controlled by a first word line.

2. The array of claim 1 further comprising a fourth pass-switch connected between the data storage device and a second bit-line, the fourth pass-switch being operatively controlled by a second word line.

3. The array of claim 2 wherein the data storage device is a capacitor.

4. The array of claim 3 wherein the First Bit Line and the Second Bit Line are one line.

5. The array of claim 3 wherein the search line and the second bit line are one line.

6. The array of claim 2 wherein each of the First, Second, third and fourth pass-switches is a field effect transistor (FET).

7. The array of claim 2 wherein each of the first, second, third and fourth pass-switches is an N-Type device.

8. The array of claim 2 wherein the pass-gate is a part of a match line pass-gate and is coupled between a match line and ground.

9. The array of claim 2 wherein the data storage device stores a binary Bit, and the logical value of the Bit can be determined by reading through the third pass-switch without destroying the Bit stored in the data storage device.

10. The array of claim 9 wherein a CAM search can be performed after a reading of the Bit stored in the data storage device and before a subsequent refresh-write into the same data storage device has been completed.

11. The array of claim 9 wherein the second bit line is adapted to store the Bit during a CAM search operation.

12. The array of claim 9 wherein the Bit can be transferred to the data storage device through the fourth pass-switch during a CAM search operation without interfering with the CAM search operation.

13. Wherein the first bit line and the second bit line is operatively coupled to a register that is adapted to store the Bit.

14. The array of claim 1 wherein the first bit line is coupled to a sense amplifier (SA) adapted to detect the state of the second pass-switch.

15. A method for performing a plurality of CAM searches in a CAM array having a CAM entry that has a word of searchable data stored in a plurality of storage capacitors, comprising:
 (a) performing a non-destructive determination of the word; and
 (b) performing a CAM search after performing (a).

16. The method of claim 15 further comprising (c) writing the word back into the plurality of storage capacitors, wherein (b) is performed before (c) has been completed.

17. The method of claim 16 further comprising (d) performing and error-detection process on the word determined in (a), wherein (d) is completed prior to (c).

18. The method of claim 15 further comprising (d) performing and error-detection process on the word determined in (a).

19. A method for performing a plurality of CAM searches in a CAM array having a CAM entry that has a word of searchable data stored in a plurality of storage capacitors, comprising:
 (a) performing a non-destructive determination of the word; and
 (b) performing a CAM search before performing (a).

* * * * *

UNITED STATES PATENT AND TRADEMARK OFFICE
CERTIFICATE OF CORRECTION

PATENT NO. : 6,430,073 B1
DATED : August 6, 2002
INVENTOR(S) : Baston et al.

It is certified that error appears in the above-identified patent and that said Letters Patent is hereby corrected as shown below:

Column 2,
Line 2, change "pass-Docket Transistor" to -- pass-transistor --

Column 3,
Line 56, change "e.g. T1-T2" to -- e.g. T0-T2 --

Column 4,
Line 50, change "also" to -- al., -- so it reads "Towler et al.,"

Column 9,
Line 17, change "TO" to -- T0 -- and "Ti" to -- T1 --;
Line 21, delete "ail" so it reads ") through";
Line 26, change "before 312 15 or" to -- before 312 or --;
Line 49, insert missing end paren so it reads "(e.g. 316 and 336)"

Column 10, line 67 to Column 11, line 1,
Change "pass-Docket transistors" to -- pass-transistors --

Column 11,
Line 24, change "error-Docket detection" to -- error-detection --;
Line 39, add a hyphen, so it reads "source-substrate";
Line 47, change "higer" to -- higher --

Column 12,
Line 23, change "passe-transistors" to -- pass-transistors --

Column 13,
Line 19, change "passs-witch" to -- pass-switch --;
Line 50, change "First, Second," to -- first, second, --

UNITED STATES PATENT AND TRADEMARK OFFICE
CERTIFICATE OF CORRECTION

PATENT NO. : 6,430,073 B1
DATED : August 6, 2002
INVENTOR(S) : Baston et al.

It is certified that error appears in the above-identified patent and that said Letters Patent is hereby corrected as shown below:

<u>Column 14,</u>
Line 21, claim 13 should begin: -- The array of claim 2 wherein --

Signed and Sealed this

Fourteenth Day of June, 2005

JON W. DUDAS
*Director of the United States Patent and Trademark Office*